United States Patent
Yamada

(10) Patent No.: US 9,581,641 B2
(45) Date of Patent: Feb. 28, 2017

(54) WAFER INSPECTION APPARATUS

(71) Applicant: TOKYO ELECTRON LIMITED, Tokyo (JP)

(72) Inventor: Hiroshi Yamada, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 6 days.

(21) Appl. No.: 14/827,190

(22) Filed: Aug. 14, 2015

(65) Prior Publication Data

US 2016/0054375 A1 Feb. 25, 2016

(30) Foreign Application Priority Data

Aug. 20, 2014 (JP) .................................. 2014-167277

(51) Int. Cl.
*G01R 31/00* (2006.01)
*G01R 31/28* (2006.01)

(52) U.S. Cl.
CPC ................................ *G01R 31/2891* (2013.01)

(58) Field of Classification Search
CPC .. G01R 1/0408; G01R 1/0433; G01R 1/0483; G01R 1/07314; G01R 31/26; G01R 31/2808; G01R 31/2886; G01R 31/2642; G01R 31/2648; G01R 31/2831; G01R 31/31702; G01R 1/073; G01R 1/07328; G01R 31/2893
See application file for complete search history.

(56) References Cited

U.S. PATENT DOCUMENTS

| 3,656,454 A | * | 4/1972 | Schrader | ............... C23C 14/505 |
| | | | | 118/719 |
| 5,870,271 A | * | 2/1999 | Herchen | ............... H02N 13/00 |
| | | | | 361/234 |
| 2010/0159403 A1 | * | 6/2010 | Shibazaki | ........... G03F 7/70716 |
| | | | | 430/325 |

FOREIGN PATENT DOCUMENTS

JP 200222768 1/2002

* cited by examiner

*Primary Examiner* — Tung X Nguyen

(57) ABSTRACT

A wafer inspection apparatus includes a probe card, a chuck top, and a vacuum mechanism for evacuating a surrounding space surrounded by the chuck top and the probe card to a set pressure. The vacuum mechanism includes an electro-pneumatic regulator having a proportional control valve, a pressure sensor, and a valve control unit to control the proportional control valve such that a pressure measured by the pressure sensor becomes close to or equal to a set pressure; and a gas channel network switched between first mode in which a second port of the proportional control valve is connected to the surrounding space via the pressure sensor and second mode in which the second port of the proportional control valve is connected to the surrounding space and the pressure sensor is connected to the surrounding space in parallel with the proportional control valve.

8 Claims, 9 Drawing Sheets

WAFER INSPECTION APPARATUS

CROSS-REFERENCE TO RELATED APPLICATION

This application claims priority to Japanese Patent Application No. 2014-167277 filed on Aug. 20, 2014, the entire contents of which are incorporated herein by reference.

FIELD OF THE INVENTION

The disclosure relates to a wafer inspection apparatus for inspecting a wafer by using a probe card.

BACKGROUND OF THE INVENTION

Generally, in manufacturing semiconductor devices, after all wafer level processes are completed, the semiconductor devices, e.g., integrated circuits, formed on a wafer are inspected to determine whether or not the semiconductor devices have required electrical characteristics. In this wafer inspection process, a probe card having a plurality of needle-shaped contactors is used as an inspection jig.

In order to perform the wafer inspection, the probe card and the wafer are aligned such that the contactors are respectively made to face corresponding electrodes of a surface of the wafer and, then, a proper press-contact is made therebetween. After leading ends of the contactors are brought into contact with the wafer surface, the contactors are relatively pressed by a predetermined stroke, i.e., by an overdrive amount. Accordingly, the leading ends of the contactors are respectively brought into pressure-contact with the corresponding electrodes while breaking a protective film or a contamination film on the wafer surface.

Recently, there is developed a wafer inspection apparatus that allows a wafer to be inspected by one of a plurality of probe cards provided in an inspection chamber while another wafer is being transferred, pressed against or separated from another probe card by a common transfer robot or a common moving table. In this wafer inspection apparatus, one moving table is commonly used for the multiple probe cards and, thus, a configuration of a prober, especially around a wafer support or a chuck top, becomes simple. Further, the integration of probers and the space efficiency are considerably improved (see, e.g., Japanese Patent Application Publication No. 2002-22768).

In the above wafer inspection apparatus having one moving table commonly used for a plurality of probe cards, when the wafer on the chuck top is brought into press-contact with each of the probe card, there is formed a sealable surrounding space for applying a vacuum attractive force to a gap between the probe cards and the chuck top.

In order to form such a surrounding space, a vertically extensible/contractible cylindrical member, e.g., a bellows, is provided around each of the probe cards. Upon completion of the position alignment between the probe card and the wafer, the surrounding space is sucked to vacuum in association with or in response to the lifting of the chuck top by the moving table. Accordingly, an upward force is generated by a pressure difference between a pressure (negative pressure) in the surrounding space and an ambient pressure (atmospheric pressure) and applied to the chuck top. Due to the upward force caused from the vacuum attractive force, each contactor of the probe card can be stably in pressure-contact with each corresponding electrode pad on the wafer surface by a predetermined pressure.

The vacuum attraction of the surrounding space is desirably carried out at a high speed and in a short period of time to shorten a required time or a tact for the wafer inspection. However, if the surrounding space is depressurized to a set pressure (negative pressure) at a high speed, the pressure in the surrounding space shows an undershoot waveform and exceeds an absolute value of the set pressure. The contactors or the electrode pads are easily damaged by an excessive vacuum attractive force.

SUMMARY OF THE INVENTION

In view of the above, the disclosure provides a wafer inspection apparatus that can quickly and stably perform evacuation for generating a desired vacuum attractive force in wafer level inspection performed by making press-contact between a probe card and a wafer by the vacuum attractive force.

In accordance with an aspect of the present invention, there is provided a wafer inspection apparatus including: a probe card having a plurality of contactors to be respectively brought into contact with a plurality of electrodes formed on a surface of a wafer as an inspection target; a chuck top on which the wafer is mounted to face the probe card; a vacuum mechanism configured to evacuate a sealable surrounding space surrounded by the chuck top and the probe card to a set pressure to allow or maintain a predetermined pressure-contact state between the probe card and the wafer, wherein the vacuum mechanism includes: a vacuum source; an electropneumatic regulator having a proportional control valve having a first port connected to the vacuum source and a second port connected to the surrounding space, a pressure sensor configured to measure a pressure in a predetermined gas channel or a space which is sealed and connected to the second port, and a valve control unit configured to control the proportional control valve such that a pressure measured by the pressure sensor becomes close to or equal to the set pressure in response to an electrical signal instructing a desired set pressure; and a gas channel network configured to be switched between a first mode in which the second port of the proportional control valve is connected to the surrounding space via the pressure sensor and a second mode in which the second port of the proportional control valve is connected to the surrounding space and the pressure sensor is connected to the surrounding space in parallel with the proportional control valve.

In the above apparatus, if the first mode is selected in a state where the pressure in the surrounding space is close to the atmospheric pressure, the proportional control valve, the pressure sensor and the valve control unit of the electropneumatic regulator operate by pressure feedback control such that the pressure measured by the pressure sensor becomes the set pressure. Accordingly, the pressure in the surrounding space is exponentially decreased from an initial pressure close to the atmospheric pressure to a level close to the set pressure within a short period of time. The pressure sensor used at this time is disposed between the second port of the proportional control valve and the surrounding space and at a downstream side in the gas exhaust passageway compared to the surrounding space (which is relatively close to the proportional control valve). Thus, even when the pressure measured by the pressure sensor reaches the set pressure, the pressure in the surrounding space disposed at an upstream side in the gas exhaust passageway compared to the pressure sensor (which is relatively far from the proportional control valve) does not reach the set pressure. The pressure in the surrounding space is saturated at a higher level than that.

If the first mode is switched to the second mode, the proportional control valve, the pressure sensor and the valve control unit of the electropneumatic regulator operate by the pressure feedback control such that the pressure measured by the pressure sensor becomes the set pressure. Since the pressure sensor is disposed at the upstream side in the gas exhaust passageway compared to the surrounding space, the pressure in the surrounding space is shifted from a saturated value or a stable value to the set value in a stepwise manner and maintained at the set value.

In the wafer inspection apparatus of the disclosure, with the above-described configuration and operation, it is possible to perform quickly and stably the evacuation for generating a desired vacuum attractive force in wafer level inspection performed by making pressure-contact between the probe card and the wafer by the vacuum attractive force.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

Figure 1:
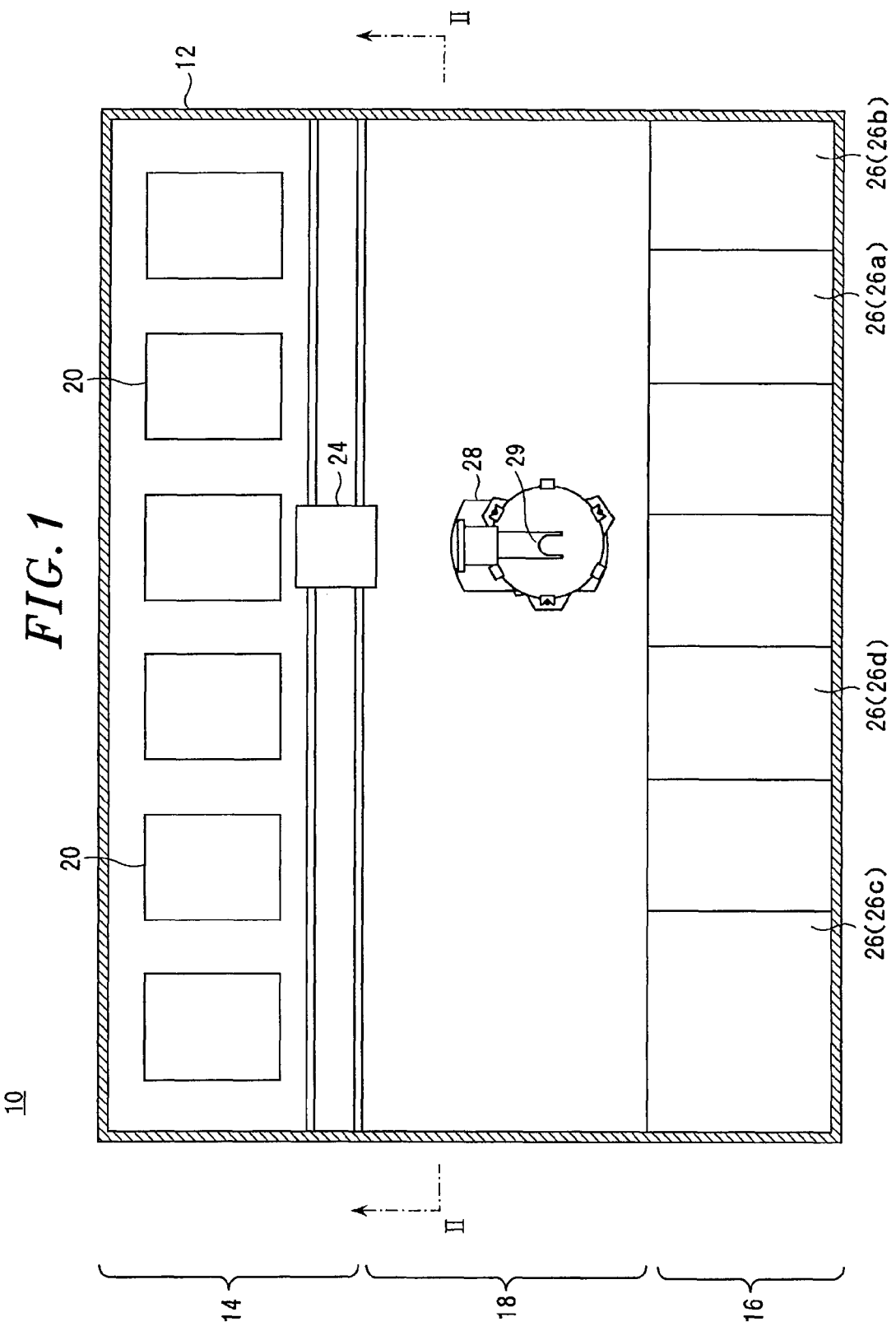
FIG. 1 is a top view schematically showing an overall configuration of a wafer inspection apparatus according to an embodiment.
Figure 2:
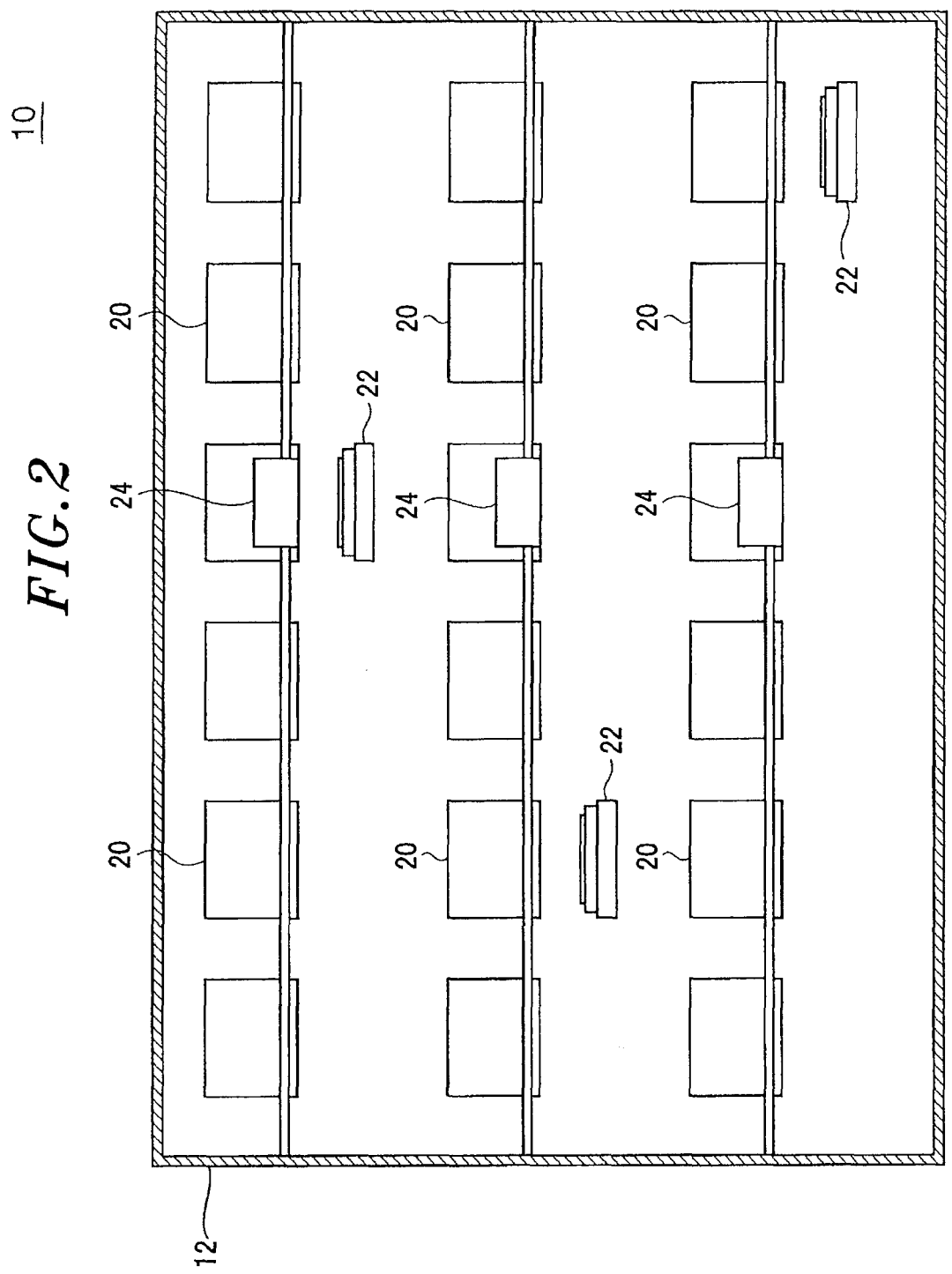
FIG. 2 is a side view schematically showing the overall configuration of the wafer inspection apparatus.

FIGS. 1 and 2 schematically show an overall configuration of a wafer inspection apparatus according to an embodiment.

(Layout of the Entire System)

As shown in FIGS. 1 and 2, a wafer inspection apparatus 10 includes a wafer inspection chamber 12 three-dimensionally accommodating a plurality of probers to each of which a probe card is attached. As can be seen from the top view of FIG. 1, an inner space of the wafer inspection chamber 12 is partitioned into an inspection area 14, a loading/unloading area 16, and a transfer area 18. In the inspection area 14, there is performed wafer level inspection of electrical characteristics of a plurality of semiconductor devices formed on a wafer as an inspection target. In the loading/unloading area 16, the wafer and the probe card are loaded/unloaded and man-machine interface of a control system is performed. The transfer area 18 is disposed between the inspection area 14 and the loading/unloading area 16.

As can be seen in FIG. 2, in the inspection area 14, tester built-in probers 20 that are test devices or interfaces for wafer inspection are provided in multiple stages, e.g., three stages. In each stage, a plurality of probers 20 are arranged in a single horizontal row. Further, in each stage, a single moving table 22 capable of moving along the arrangement direction (horizontal direction) of the plurality of (e.g., six) probers 20 arranged in a single horizontal row is provided below the probers 20 and a single camera 24 capable of moving along the arrangement direction is provided at a front or side portion close to the transfer area 18. The moving table 22 can access a position immediately below the probers 20 by horizontal movement. The moving table 22 includes a multi-axis moving mechanism that moves a chuck top for mounting thereon the wafer in a vertical direction on a horizontal plane so that the wafer as an inspection target can be position-aligned, and pressed against or separated from a probe card attached to each of the probers 20. The camera 24 is used for, e.g., position alignment of the wafer in each prober 20.

The loading/unloading area 16 is partitioned into a plurality of accommodating spaces 26. Installed in the accommodating spaces 26 are a carrier port 26a for receiving a container, e.g., a FOUP, accommodating a predetermined number of wafers; an aligner 26b for performing position alignment of the wafer; a probe card loader 26c for loading/unloading a probe card that has been used or will be used in the wafer inspection apparatus 10; and a system controller 26d for performing overall control of the components in the wafer inspection apparatus 10.

In the transfer area 18, there is provided a three-dimensionally movable transfer robot 28 that can move in the transfer area 18 and access the inspection area 14 and the loading/unloading area 16. The transfer robot 28 transfers an inspected wafer or a wafer to be inspected between the carrier port 26a and any prober 20 in the inspection area 14. Further, the transfer robot 28 transfers an old probe card and a new probe card, which are to be exchanged, between the probe card loader 26c and any prober 20 in the inspection area 14. The transfer robot 28 has a pair of transfer arms 29, and is configured to take a wafer from a target place with one of the transfer arms 29 and transfer another wafer held by the other transfer arms 29 to the target place in pick and place manner.

In this wafer inspection apparatus 10, the probes 20 to each of which the probe card is attached are three-dimensionally arranged at multiple stages in the wafer inspection chamber 12. The single moving table 22 is commonly used for the plurality of probers 20 arranged in one horizontal row in each stage. While the wafer is pressed against or separated from a probe card of one of the probers 20 by the moving table 22, another wafer is inspected by another prober 20. Thus, the configuration of the prober 20, especially around the chuck top, becomes simple. Further, the space efficiency of the wafer inspection chamber 12 (especially, a footprint) is considerably improved by the three-dimensionally integrated arrangement of the probers 20.

(Configuration Around the Prober)

Figure 3:
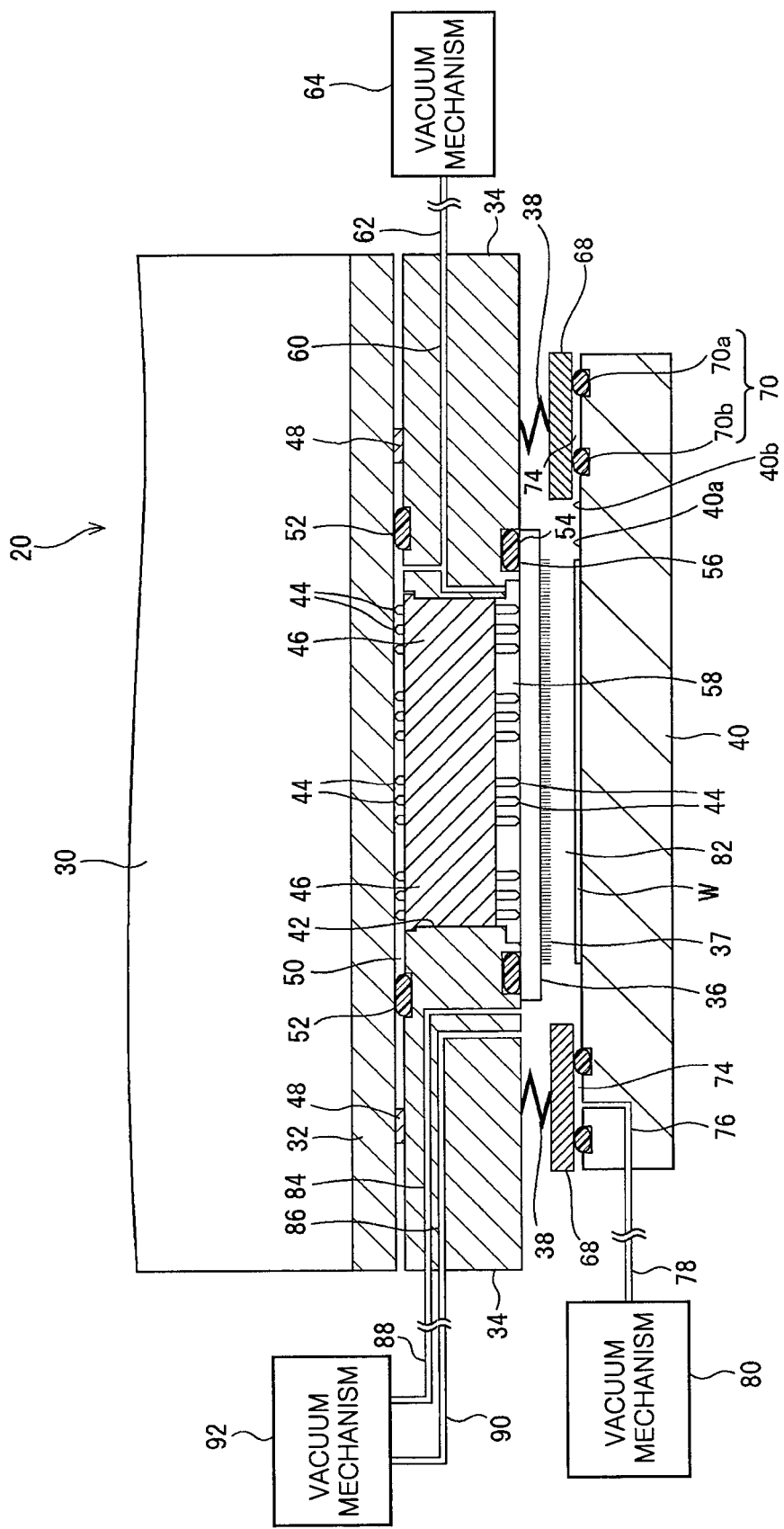
FIG. 3 is a cross sectional view showing principal parts of a prober according to the embodiment.

FIG. 3 shows a main configuration of the prober 20 according to the embodiment. The prober 20 has therein a tester 30 as one unit. The prober 20 includes: a probe card 36 detachably attached to a mother board 32 of the tester 30 through a thick plate-shaped pogo frame 34; an extensible/contractible cylindrical member, e.g., a bellows 38, provided around the probe card 36; and a thick plate-shaped chuck top 40 on which a wafer W as an inspection target is mounted to face the probe card 36.

Formed at the central portion of the pogo frame 34 is a through hole or a pogo block mounting hole 42 having a diameter smaller than a diameter of the probe card 36. An approximately cylindrical or disc-shaped pogo block 46 which holds a plurality of pogo pins 44 vertically penetrating therethrough is detachably inserted into the pogo block mounting hole 42. Leading ends (lower ends) of the pogo pins 44 are respectively brought into elastic press-contact with corresponding electrodes on a top surface of the probe card 36 by a vacuum attractive force applied to the pogo frame 34 and the probe card 36 by a first vacuum mechanism 64 (see FIG. 3) to be described later. Top ends (upper ends) of the pogo pins 44 are pressed against electrodes of the mother board 32 which correspond thereto.

A plurality of needle-shaped contactors or contact probes 37 is attached to the probe card 36 in a predetermined pattern. Leading ends of the contact probes 37 protrude from a bottom surface of the probe card 36 to face the corresponding electrode pads on the surface of the wafer W mounted on the chuck top 40.

A gap 50 is formed between the pogo frame 34 and the mother board 32 with an annular spacer 48 interposed therebetween. The gap 50 is divided in a radial direction by the annular seal member 52 provided around a pogo block attachment area. A gap 56 is formed between the pogo frame 34 and the probe card 36 and divided in a radial direction by an annular seal member 54 provided around the pogo block attachment area. Accordingly, a suction space 58 surrounded by the mother board 32, the probe card 36 and the seal members 52 and 54 is formed.

The suction space 58 is connected to the first vacuum mechanism 64 for holding a probe card through a gas channel 60 and an external line 62 formed at a peripheral portion of the pogo frame 34. The first vacuum mechanism 64 has a vacuum source such as a vacuum pump, a factory vacuum source or the like. The first vacuum mechanism 64 depressurizes the suction space 58 to a predetermined negative pressure and maintains the depressurized state. Accordingly, the probe card 36 and the pogo frame 34 are fixed to the mother board 32 by an upward force generated by a pressure difference between the pressure (negative pressure) in the suction space 58 and an ambient pressure.

The bellows 38 is made of a metal and is extensible and contractible in a vertical direction, i.e., in a direction perpendicular to a flat surface of the probe card 36. An upper end of the bellows 38 is coupled to a bottom surface of the pogo frame 34. A lower end of the bellows 38 is detachably coupled to a top surface of a peripheral portion of the chuck top 40 via an annular lower flange 68 by a vacuum attractive force.

More specifically, the top surface of the chuck top 40 is divided into a wafer mounting surface 40a, i.e., a central portion for mounting thereon the wafer W, and a bellows connecting surface 40b, i.e., a peripheral portion extending in an annular shape at an outer side in a radial direction of the wafer mounting surface 40a. Provided at the bellows connecting surface 40b is a seal member 70 formed of two O-rings 70a and 70b having different diameters and disposed in a concentric circular shape. Lower portions of the O-rings 70a and 70b are fixed to a recessed part of the bellows connecting surface 40b. Upper portions of the O-rings 70a and 70b protrude beyond the bellows connecting surface 40b. In a state where top end surfaces of the O-rings 70a and 70b are in contact with a bottom surface of the lower flange 68, an annular space 74 between the O-rings 70a and 70b serves as a sealable suction space.

The suction space 74 is connected to a second vacuum mechanism 80 for a bellows through a gas channel 76 formed in the chuck top 40 and an external line 78. The second vacuum mechanism 80 has a vacuum source such as a vacuum pump, a factory vacuum source or the like. Since the volume of the suction space 74 is small, the sealed suction space 74 can be instantly depressurized from the atmospheric pressure to the predetermined negative pressure. Due to the vacuum evacuation, a downward force generated by a pressure difference between the pressure (negative pressure) in the suction space 74 and the ambient pressure, i.e., the atmospheric pressure, is applied to the lower flange 68. Accordingly, the lower end of the bellows 38 is coupled to the bellows connecting surface 40b of the chuck top 40 via the lower flange 68 and the seal member 70.

In a state where the lower end of the bellows 38 is coupled to the bellows connecting surface 40b of the chuck top 40, a suction space or a surrounding space 82 which can be sealed is formed between the probe card 36, the bellows 38, and the chuck top 40. The surrounding space 82 is connected to a third vacuum mechanism 92 for holding an overdrive through gas channels 84 and 86 formed in the pogo frame 34 and external lines 88 and 90.

Since the third vacuum mechanism 92 has a vacuum source such as a vacuum pump, a factory vacuum source, or the like, even when the volume of the surrounding space 82 is considerably large, the surrounding space 82 can be depressurized quickly and in a short period of time from a reference pressure close to an atmospheric pressure to a negative set pressure at which a desired vacuum attractive force is obtained. Due to the vacuum evacuation, an upward force generated by a pressure difference between the pressure (negative pressure) in the surrounding space 82 and the ambient pressure, i.e., the atmospheric pressure, is applied to the chuck top 40. Accordingly, the wafer W on the chuck top 40 is pressed to the probe card 36 against an elastic reaction force of the contact probe 37 and the gravity acted on the chuck top 40.

When the surrounding space 82 is sucked to vacuum, if the vacuum attractive force exceeds a set value (becomes excessive) even for a moment, the electrode pads on the surface of the wafer W or the contact probes 37 are damaged or deformed. In the present embodiment, as will be described later in detail, even when the vacuum evacuation is performed by depressurizing the surrounding space 82 quickly and in a short period of time from the reference pressure close to the atmospheric pressure to the negative set pressure by the third vacuum mechanism 92, the pressure in the surrounding space 82 reaches the set pressure and becomes saturated or stable without an undershot waveform. As a result, both of the electrode pads on the surface of the wafer W and the contact probes 37 are not damaged.

(Operation of the Movable Unit in the Wafer Inspection)

Next, a main operation of the movable unit in the case of performing a single wafer inspection process in the prober 20 of the present embodiment will be described with reference to FIGS. 4A to 4D. The operation of each component in the prober 20 is controlled by a controller 102 to be described later (see FIGS. 5 to 7).

Figure 4A:
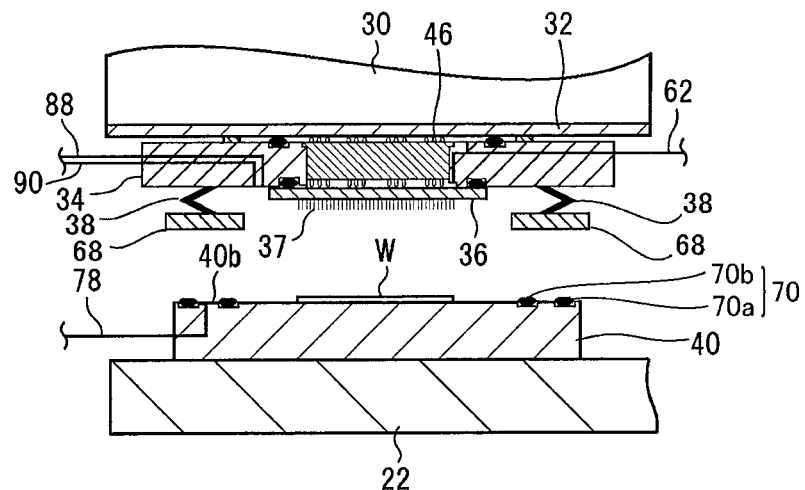
FIGS. 4A to 4D explain a main operation of a movable unit in the case of performing a single wafer inspection process in the prober according to the embodiment.

Before the wafer is inspected, the chuck top 40 is separated from the bellows 38 and supported below the probe card 36 with a large space therebetween by the moving table 22 as shown in FIG. 4A. In that state, the wafer W to be inspected is mounted on the chuck top 40 by the transfer robot 28 (see FIG. 1). The wafer W mounted on the chuck top 40 is fixed and held by a vacuum or mechanical type chuck mechanism (not shown) provided at the chuck top 40.

At this time, the first vacuum mechanism 64 maintains an ON state and the second and the third vacuum mechanism 80 and 92 maintain OFF states.

After the wafer W is mounted on the chuck top 40, the position alignment between the probe card 36 and the wafer W in the horizontal plane is performed by the camera 24 (see FIG. 2) and the moving table 22.

Figure 4B:
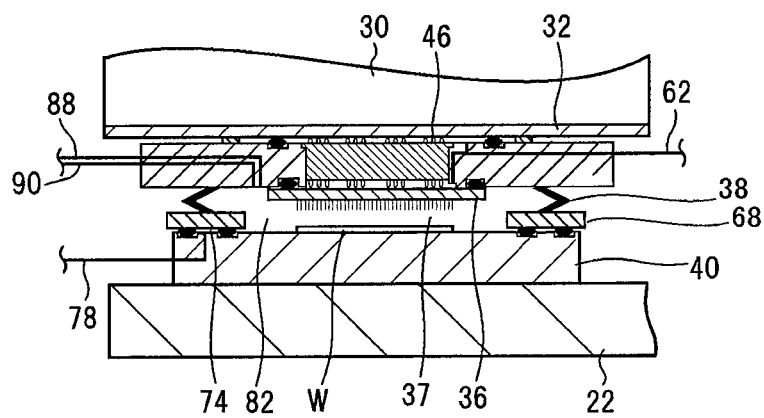

Upon completion of the position alignment, the moving table 22 operates the elevation moving unit to lift the chuck top 40 in the vertical direction. Accordingly, the second vacuum mechanism 80 is switched ON and the bellows 38 is connected to the chuck top 40 when or immediately after the seal members 70 (O-rings 70a and 70b) protruding beyond the bellows connecting surface 40b of the chuck top 40 are brought into contact with the bottom surface of the lower flange 68, as shown in FIG. 4B. When the bellows 38 is connected to the chuck top 40, the sealable surrounding space 82 is formed between the probe card 36, the bellows 38, and the chuck top 40. In that state, the third vacuum mechanism 92 still maintains the OFF state.

Figure 4C:
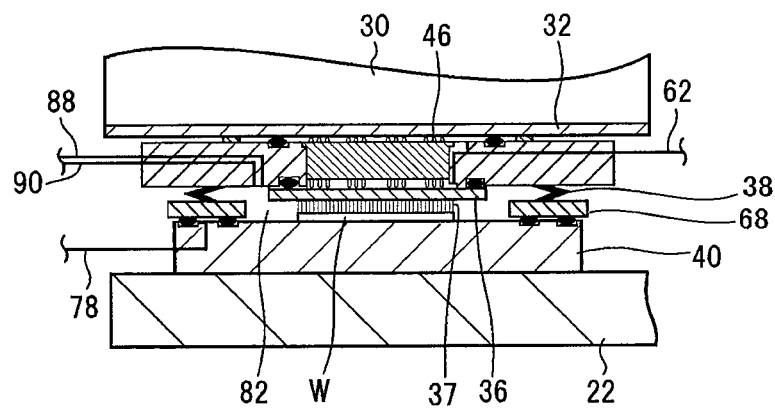

Then, the moving table 22 continues the lifting of the chuck top 40. As a consequence, the surface of the wafer W is brought into contact with the leading ends of the contact probes 37 of the probe card 36, as shown in FIG. 4C. The moving table 22 further lifts the chuck top 40 by a predetermined distance, i.e., an overdrive amount, against an elastic reaction force of the contact probes 37. Due to the overdrive operation, the leading ends of the contact probes 37 becomes in press-contact with the electrode pads corresponding thereto while breaking the protective film or the contamination film on the surface of the wafer W.

Figure 4D:
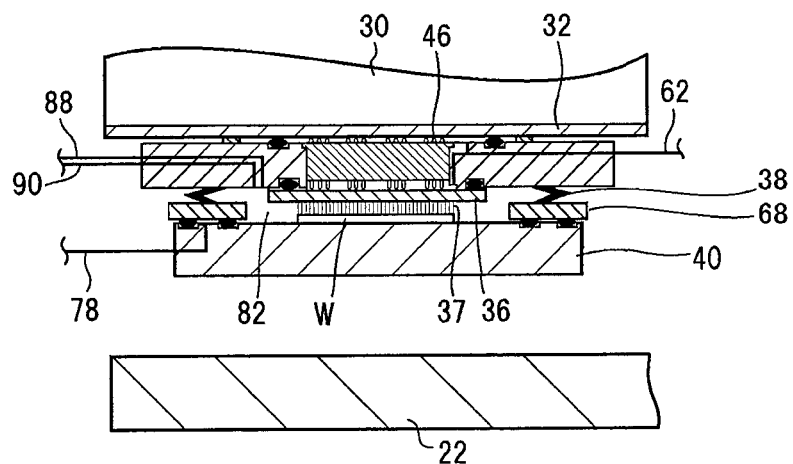

In the present embodiment, the third vacuum mechanism 92 for holding an overdrive is switched ON in a state where the probe card 36 and the wafer W are pressed at a predetermined pressure and brought into contact with each other upon completion of the lifting operation of the chuck top 40 by the moving table 22 and the overdrive operation. As described above, when the vacuum mechanism 92 is switched ON, the surrounding space 82 is depressurized quickly and in a short period of time from the reference pressure close to the atmospheric pressure to the negative set pressure by the vacuum evacuation. As a consequence, a constant upward force generated by the pressure difference between the pressure (negative pressure) in the surrounding space 82 and the ambient atmospheric pressure is applied to the chuck top 40. Accordingly, the press-contact state between the probe card 36 and the wafer W is maintained. Thereafter, the moving table 22 is downwardly separated from the chuck top 40 and then moved to another prober 20 in the same stage, as shown in FIG. 4D.

In the prober 20, the tester 30 operates in a state where the press-contact state between the wafer W and the probe card 36 is maintained as described above. The tester 30 performs wafer level inspection of electrical characteristics of the wafer W through the mother board 32 and the probe card 36 (contact probes 37).

Upon completion of the wafer level inspection of electrical characteristics by the tester 30, the moving table 22 returns to the position below the chuck top 40. At this timing, the third vacuum mechanism 92 stops the vacuum evacuation and the operation of switching the surrounding space 82 from the depressurized state to the initial state close to the atmospheric pressure (pressure return operation) is performed for a predetermined period of time. Due to the pressure return operation, the vacuum attractive force that presses the wafer W on the chuck top 40 against the probe card 36 becomes weak. Thus, the chuck top 40 is lowered and the wafer W is separated from the probe card 36. Lastly, the chuck top 40 is mounted on the moving table 22.

Thereafter, the second vacuum mechanism 80 stops the vacuum evacuation and the suction space 74 is switched from the depressurized state to the initial state close to the atmospheric pressure. Since the volume of the suction space is small, the switching is executed instantly and the lower flange 68 can be separated from the bellows connecting surface 40b of the chuck top 40. When the chuck top 40 is further lowered by the moving table 22, the chuck top 40 reaches the height position same as that shown in FIG. 4A and waits for the transfer robot 28 (see FIG. 1). The transfer robot 28 reaches a vicinity of the chuck top 40 and receives the inspected wafer W. A new wafer W to be inspected by the prober 20 is mounted on the chuck top 40 by the transfer robot 28. Then, the above-described operations are performed on the new wafer W.

(Configuration of the Vacuum Mechanism for Holding an Overdrive)

Figure 5:
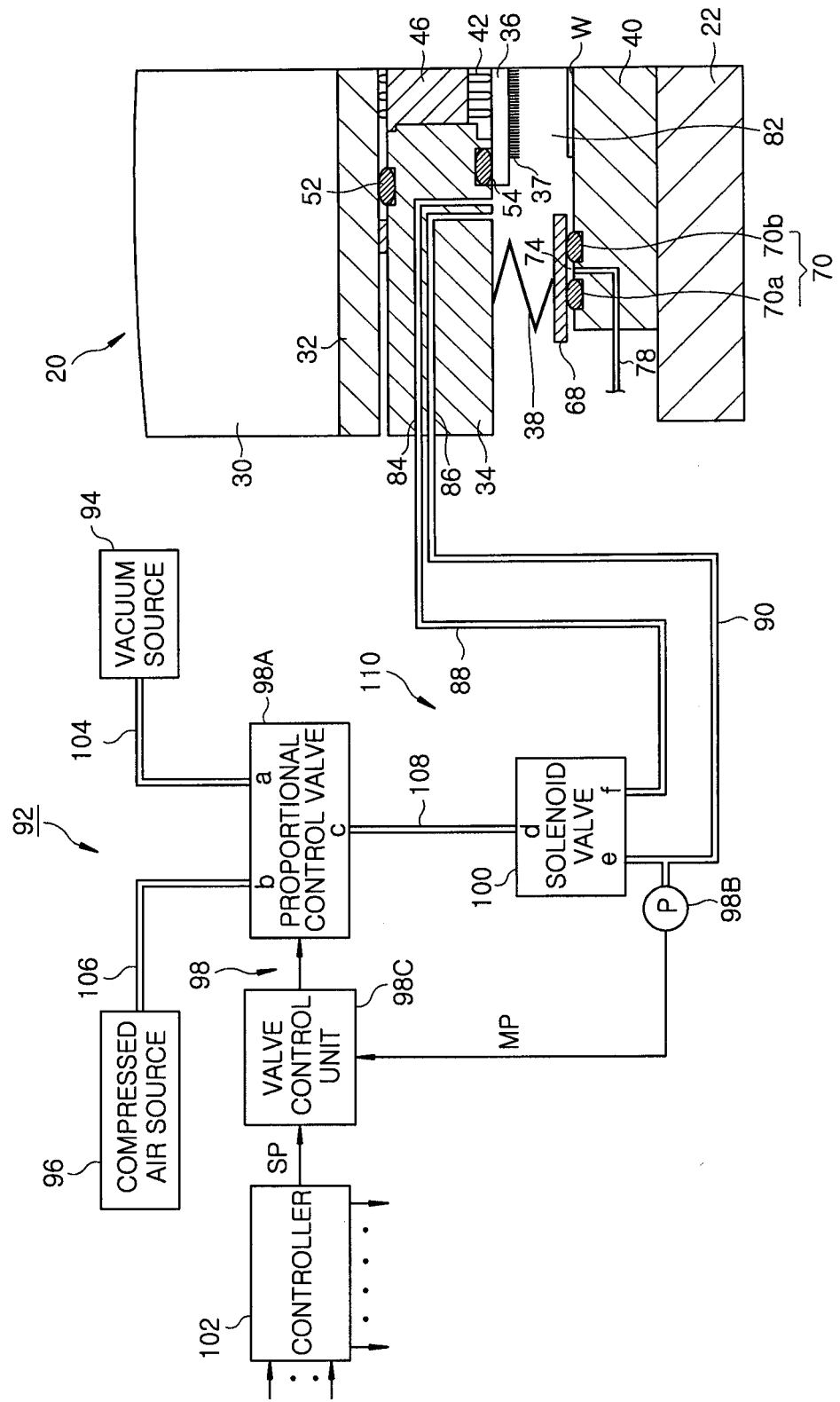
FIG. 5 is a block diagram showing a configuration of a vacuum mechanism for holding an overdrive.

Next, the configuration of the third vacuum mechanism 92 for holding an overdrive will be described with reference to FIG. 5.

The vacuum mechanism 92 can supply a negative pressure for generating a vacuum attractive force as well as a positive pressure for generating a separation force to the sealable surrounding space 82 surrounded by the probe card 36, the bellows 38 and the chuck top 40. Therefore, the vacuum mechanism 92 includes, as a pressure source, a vacuum source 94 such as a vacuum pump or a factory vacuum source and a compressed air source 96 such as a compressor or the like. Further, the vacuum mechanism 92 has, as main components, an electropneumatic regulator 98, a solenoid valve 100 and a controller 102. The electropneumatic regulator 98 has a proportional control valve 98A, a pressure sensor 98B and a valve control unit 98C. The controller 102 controls the operation or the state of each component in the vacuum mechanism 92.

More specifically, the output port of the vacuum source 94 is connected to a port "a" of the proportional control valve 98A of the electropneumatic regulator 98 through a line 104. The output port of the compressed air source 96 is connected to a port "b" of the proportional control valve 98A through a line 106.

The proportional control valve 98A has a port "c" in addition to the port "a" and the port "b". In the proportional control valve 98A, the port "a" and the port "b" are connected in parallel to the port "c". The electropneumatic regulator 98 is configured to control a pressure of the port "c" to a proper set value within a predetermined range by mixing a negative pressure inputted to the port "a" of the proportional control valve 98A and a positive pressure inputted to the port "b" at a proper ratio. A lower limit of the above range corresponds to an output value (negative pressure) of the vacuum source 94 and an upper limit corresponds to an output value (positive pressure) of the compressed air source 96. The port "c" of the proportional control valve 98A is connected to a port "d" of the solenoid valve 100 through a line 108.

The solenoid valve 100 has a port "e" and a port "f" in addition to the port "d". In the solenoid valve 100, one of the port "e" and the port "f" is selectively connected to the port "d". The port "e" is connected to the surrounding space 82 through the line 90 and the gas channel 86 formed in the pogo frame 34. A pressure sensor 98B of the electropneumatic regulator 98 is installed in the line 90. The port "f" is connected to the surrounding space 82 through the line 88 and the gas channel 84 formed in the pogo frame 34.

The pressure sensor 98B forms a part of the electropneumatic regulator 98 as described above. An output signal of the pressure sensor 98B, i.e., a measured pressure signal MP indicating a pressure in the line 90, is applied to the valve control unit 98C. The valve control unit 98C generates a comparison error by comparing the measured pressure signal MP from the pressure sensor 98B and a set pressure signal SP indicating a set value of the pressure in the surrounding space 82 which is instructed by the controller 102. The valve control unit 98C controls driving of a valve actuator in the proportional control valve 98A such that the comparison error becomes close to 0. In the present embodiment, the measured pressure signal MP from the pressure sensor 98B can be inputted to not only the valve control unit 98C but also the controller 102.

In the present embodiment, a gas channel network 110 of the vacuum mechanism 92 includes the solenoid valve 100, the lines 88, 90 and 108, and the controller 102. As will be described above, the gas channel network 110 is configured to be switched between a first mode and a second mode. In the first mode, the port "c" of the proportional control valve 98A is connected to the surrounding space 82 via the pressure sensor 98B. In the second mode, the port "c" of the proportional control valve 98A is connected to the surrounding space 82 and the pressure sensor 98B is connected to the surrounding space 82 in parallel with the proportional control valve 98A.

(Operation of the Vacuum Mechanism for Holding an Overdrive)

Figure 6:
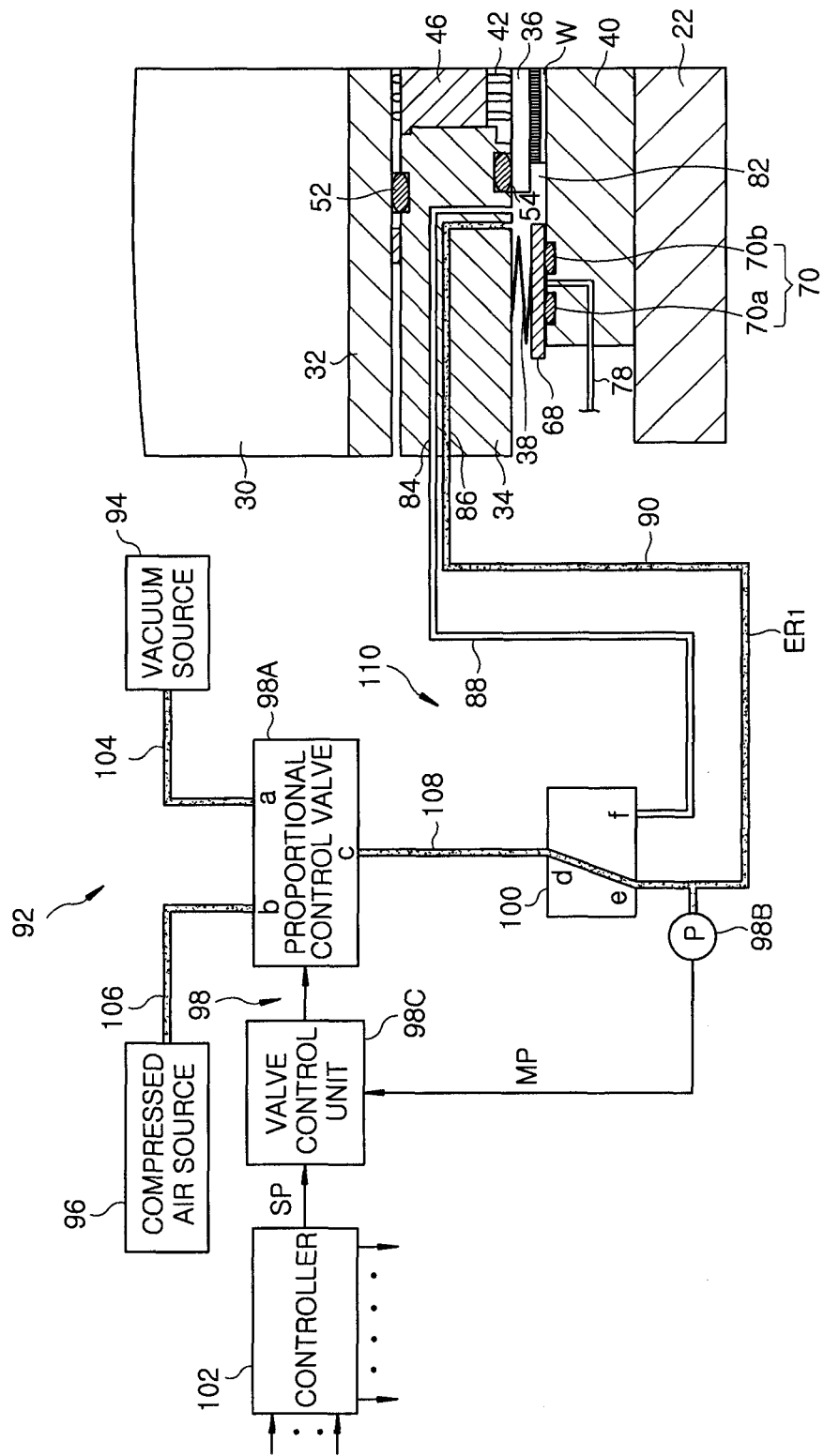
FIG. 6 shows a state of each component of the vacuum mechanism in a pressure decrease mode.

Hereinafter, the operation of the vacuum mechanism 92 will be described with reference to FIGS. 6 to 8. The operation of each component in the vacuum mechanism 92 is controlled by the controller 102. The controller 102 includes a microprocessor (CPU) and executes a program that can be downloaded from another computer via a network or can be read out from a recording medium such as a semiconductor memory, an optical disk, a magneto-optical disk, a magnetic tape, or the like.

As described above, in the wafer inspection process, the moving table 22 lifts the chuck top 40 in the vertical direction after the position alignment between the probe card 36 and the wafer W is completed. At this time, in the vacuum mechanism 92, the compressed air source 96 and the electropneumatic regulator 98 maintain the OFF state. In the solenoid valve 100, the port "d" and the port "f" are connected.

Accordingly, if the chuck top 40 is further lifted by the moving table 22 after the bellows 38 is connected to the chuck top 40, i.e., after the sealable surrounding space 82 is formed between the probe card 36, the bellows 38, and the chuck top 40, the volume of the surrounding space 82 is reduced in the vertical direction and air in the surrounding space 82 is pushed out and discharged to the vacuum mechanism 92 side. At this time, in the vacuum mechanism 92, preferably, the port "c" of the proportional control valve 98A is blocked from the surrounding space 82 by a switching valve (not shown) of the gas channel network 110. The air that has been sent from the surrounding space 82 to the gas channel network 110 of the vacuum mechanism 92 through the gas channels 84 and 86 formed in the pogo frame 34 is discharged to the atmosphere from an atmosphere port or relief port (not shown) provided at the gas channel network 110. Therefore, in an atmosphere open mode, even if the volume of the surrounding space 82 is changed, the pressure $P_{82}$ in the surrounding space 82 is maintained at a level close to the atmospheric pressure.

Figure 8:
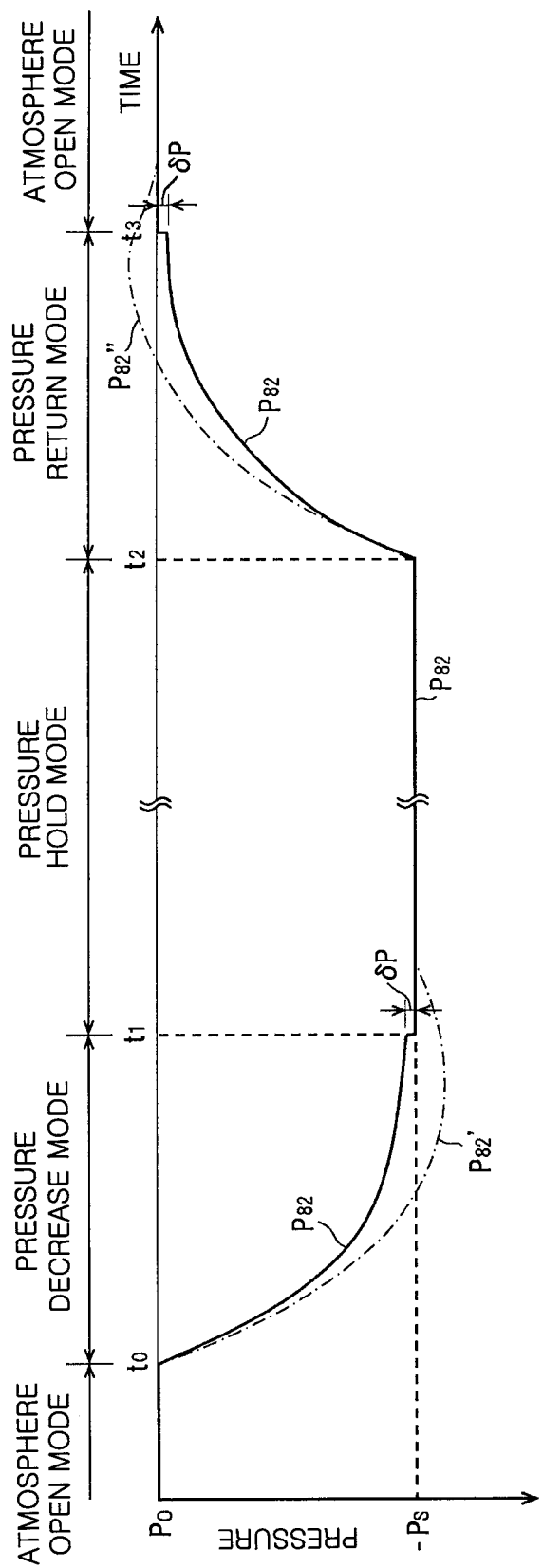
FIG. 8 is a waveform diagram showing an operation of the vacuum mechanism (waveform of a pressure in a surrounding space).

Upon completion of the operation of lifting the chuck top 40 by the moving table 22 and the overdrive operation, the vacuum mechanism 92 is switched from the atmosphere open mode to a pressure decrease mode (timing $t_0$ of FIG. 8). In the pressure decrease mode, the vacuum source 94, the compressed air source 96 and the electropneumatic regulator 98 are switched ON under the control of the controller 102 and the solenoid valve 100 is switched as shown in FIG. 6. In other words, in the solenoid valve 100, the port "d" and the port "e" are connected and the port "f" is disconnected. Therefore, the port "c" of the proportional control valve 98A is connected to the surrounding space 82 via a gas exhaust route $ER_1$ including the solenoid valve 100 (port "d"→port "e"), the line 90 and the gas channel 86 formed in the pogo frame 34.

When the pressure decrease mode is initiated, the air in the surrounding space 82 flows into the port "c" of the proportional control valve 98A through the gas exhaust route $ER_1$. In other words, a negative pressure from the port "c" of the proportional control valve 98A is supplied to the surrounding space 82 through the gas exhaust route $ER_1$.

In the pressure decrease mode, a feedback mechanism including the proportional control valve 98A, the pressure sensor 98B and the valve control unit 98C of the electropneumatic regulator 98 operates such that the pressure $P_{90}$ in the line 90 which is measured by the pressure sensor 98B becomes the same as a set pressure $-P_s$ instructed by the controller 102. Accordingly, the pressure $P_{82}$ in the surrounding space 82 is exponentially decreased from the reference pressure $P_0$ close to the atmospheric pressure and becomes close to the set pressure $-P_s$ within a short period of time, as shown in FIG. 8. The pressure sensor 98B is disposed between the port "c" of the proportional control valve 98A and the surrounding space 82 and at a downstream side in the gas exhaust passageway compared to the surrounding space 82 (which is relatively close to the proportional control valve 98A). Therefore, even if the measured pressure MP ($P_{90}$) from the pressure sensor 98B reaches the set pressure SP ($-P_s$), the pressure $P_{82}$ in the surrounding space 82 disposed at an upstream side in the gas exhaust passageway compared to the pressure sensor 98B (which is relatively far from the proportional control valve 98A) does not reach the set pressure SP ($-P_s$) and is saturated at a level ($-P_s+\delta P$) higher than that.

The controller 102 receives the measured pressure signal MP from the pressure sensor 98B and switches the pressure decrease mode to the pressure hold mode when the waveform of the measured pressure signal MP is shifted from a falling area to a saturated area (steady-state or stable area) (timing $t_1$ of FIG. 8).

In the pressure hold mode, only the solenoid valve 100 is switched in a state where the vacuum source 94, the compressed air source 96, and the electropneumatic regulator 98 maintains the ON state. In other words, in the solenoid valve 100, the port "d" and the port "f" are connected and the port "e" is disconnected, as shown in FIG. 7.

Accordingly, the port "c" of the proportional control valve 98A is connected to the surrounding space 82 via a gas exhaust route $ER_2$ including the line 108, the solenoid valve 100 (the port "d"→the port "f"), the line 88 and the gas channel 84 formed in the pogo frame 34. The pressure sensor 98B is connected to the surrounding space 82 via a pressure sensing route $ER_3$ or a gas exhaust route including the line having one end disconnected at the port "e" of the solenoid valve 100 and the gas channel 86 formed in the pogo frame 34.

In the pressure hold mode, the proportional control valve 98A, the pressure sensor 98B and the valve control unit 98C of the electropneumatic regulator 98 operate by feedback loop such that the pressure $P_{90}$ in the gas channel or the line 90 which is measured by the pressure sensor 98B becomes the same as the set pressure $-P_s$ instructed by the controller 102. The pressure sensor 98B is disposed at the upstream side in the gas exhaust passageway compared to the surrounding space 82 (which is relatively far from the proportional control valve 98A).

Therefore, as shown in FIG. 8, when the pressure decrease mode is switched to the pressure hold mode, the pressure $P_{82}$ in the surrounding space 82 is immediately shifted from a saturated value or a stable value $(-P_s+\delta P)$ to the set pressure $-P_s$ in a stepwise manner and then maintained at the set pressure $-P_s$. The set pressure $-P_s$ is set to a level at which a vacuum attractive force is obtained in the surrounding space 82, the vacuum attractive force being used for maintaining a state in which the probe card 36 and the wafer W are pressed at a predetermined pressure by an overdrive amount and brought into contact with each other.

In the pressure hold mode, the tester 30 can stably inspect the electrical characteristics of the wafer W via the mother board 32 and the probe card 36 (the contact probes 37). In the pressure hold mode, the moving table 22 can be separated from the chuck top 40 as shown in FIG. 7.

After the wafer level inspection of electrical characteristics is performed by the tester 30, the vacuum mechanism 92 is switched from the pressure hold mode to the pressure return mode (timing $t_2$ of FIG. 8). In the pressure return mode, only the solenoid valve 100 is switched to a state where the vacuum source 94, the compressed air source 96 and the electropneumatic regulator 98 maintain the ON state. In other words, in the solenoid valve 100, the port "d" and the port "e" are connected and the port "f" is disconnected as shown in FIG. 6. In other words, the gas channel network 110 of the vacuum mechanism 92 becomes in the same state as that of the pressure decrease mode. The set pressure applied from the controller 102 to the valve control unit 98C of the electropneumatic regulator 98 is changed from the negative set pressure $-P_s$ to the reference pressure $P_0$ close to the atmospheric pressure.

The proportional control valve 98A, the pressure sensor 98B and the valve control unit 98C of the electropneumatic regulator 98 operate by feedback control such that the pressure $P_{90}$ in the line 90 or the gas channel which is measured by the pressure sensor 98B becomes the same as the reference pressure $P_0$ close to the atmospheric pressure which is instructed by the controller 102. Accordingly, as shown in FIG. 8, the pressure $P_{82}$ of the surrounding space 82 is exponentially increased from the set pressure $-P_s$ and becomes close to the reference pressure $P_0$ close to the atmospheric pressure in a short period of time.

In that case, unlike the pressure increase mode, even when the measured pressure MP ($P_{90}$) from the pressure sensor 98B reaches the set pressure SP ($P_0$), the pressure $P_{82}$ in the surrounding space 82 disposed at the downstream side in a gas supply passageway compared to the pressure sensor 98B does not reach the set pressure SP ($P_0$) and is saturated at a level ($P_0-\delta P$) lower than that. In the pressure return mode, the gravity of the chuck top 40 exceeds the vacuum attractive force. Thus, the chuck top 40 is lowered and the wafer W is separated from the probe card 36. The chuck top 40 is mounted on the moving table 22.

The controller 102 receives the measured pressure signal MP from the pressure sensor 98B and switches the pressure return mode to the atmosphere open mode when the waveform of the measured pressure signal MP is increased and shifted from a rising area to the saturated area (timing $t_3$ of FIG. 8).

When it is switched to the atmosphere open mode, the vacuum source 94, the compressed air source 96 and the electropneumatic regulator 98 are switched OFF and the port "d" and the port "f" are connected in the solenoid valve 100. The surrounding space 82 is connected to an atmospheric port (not shown) of the vacuum mechanism 92, so that the pressure in the surrounding space 82 becomes close to or equal to the atmospheric pressure.

Figure 7:
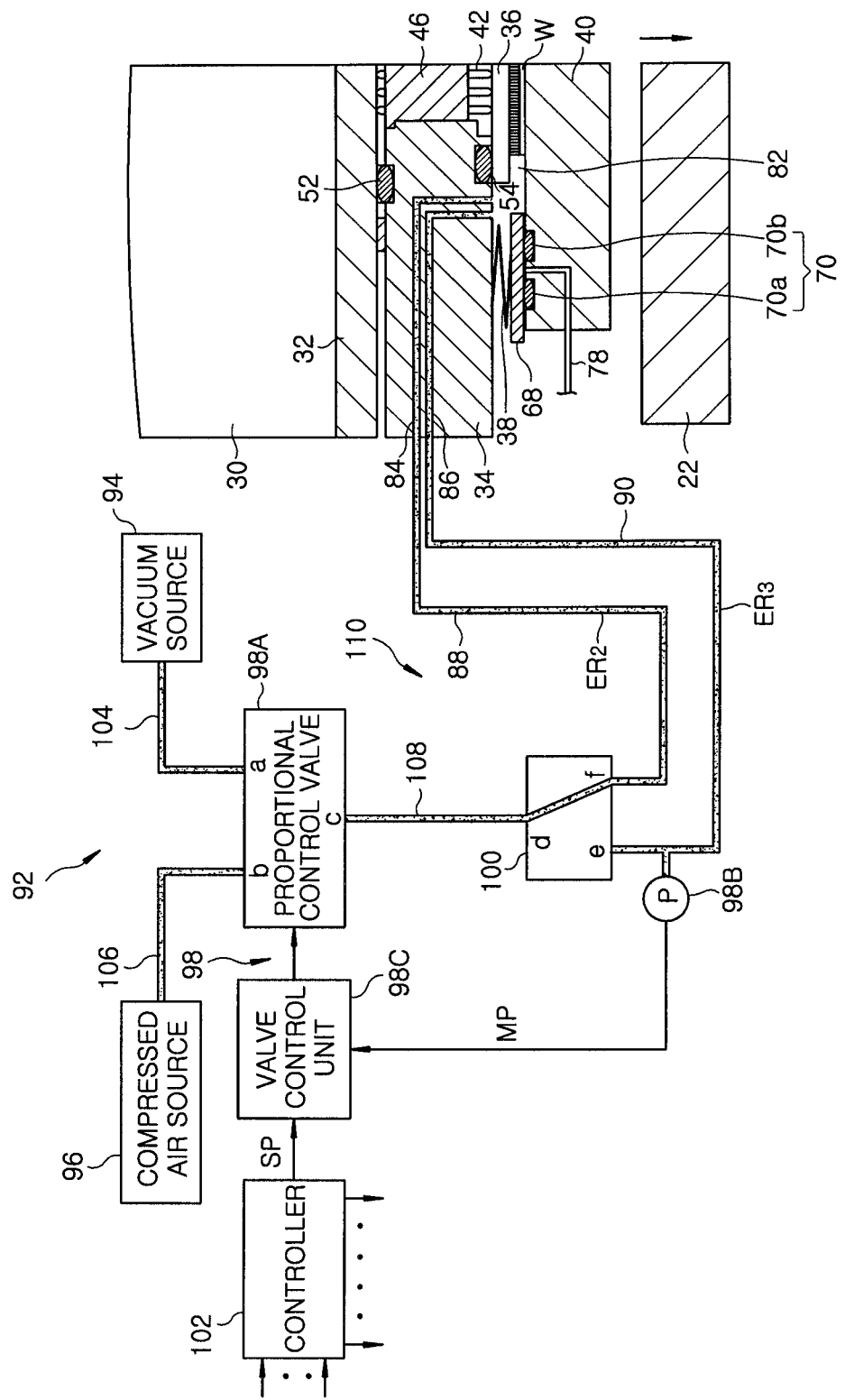
FIG. 7 shows a state of each component of the vacuum mechanism in a pressure hold mode.

When the pressure return mode is switched to the atmosphere open mode, the pressure $P_{82}$ in the surrounding space 82 can be made to forcibly and instantly reach the reference pressure $P_0$ close to the atmospheric pressure by switching ON the vacuum source 94, the compressed air source 96, and the electropneumatic regulator 98 after the port "d" and the port "f" are connected temporarily and the port "e" is disconnected in the solenoid valve 100 as shown in FIG. 7.

As described above, in the present embodiment, the vacuum attractive force is generated by sucking the surrounding space 82 to vacuum in order to maintain the state in which the probe card 36 and the wafer W are pressed by the predetermined pressure and brought into contact with each other in the sealable surrounding space 82 surrounded by the probe card 36, the bellows 38 and the chuck top 40. In the evacuation operation, when the pressure in the surrounding space 82 is decreased from the reference pressure $P_0$ close to the atmospheric pressure to the set pressure $-P_s$, the pressure $P_{82}$ in the surrounding space 82 is smoothly and quickly shifted from the falling area to the saturated area or the steady-state area close to the set pressure without an undershoot waveform indicated by a virtual line $P_{82'}$ in FIG. 8. Accordingly, the electrode pads on the surface of the wafer W or the contact probes 37 are not damaged and the wafer level inspection of electrical characteristics of the wafer W can be stably performed.

In the present embodiment, when the pressure $P_{82}$ in the surrounding space 82 is returned from the negative set pressure $-P_s$ for generating the vacuum attractive force to the reference pressure $P_0$ close to the atmospheric pressure, the pressure $P_{82}$ in the surrounding space 82 can be shifted quickly and smoothly from the rising area to the saturated area or the steady-state area close to the reference pressure without an overshoot waveform indicated by a virtual line $P_{82''}$ of FIG. 8. Accordingly, the chuck top 40 can be mounted on the moving table 22 without inflicting a great impact. As a result, the damage to the chuck top 40 can be avoided.

(Another Embodiment or Modification)

In the above embodiment, after the lifting of the chuck top 40 by the moving table 22 and the overdrive operation are completed, the probe card 36 and the wafer W are brought into press-contact with each other at a predetermined pressure and, then, the third vacuum mechanism is switched ON to maintain the press-contact state. However, the lifting operating of the chuck top 40 and the evacuation operation of the vacuum mechanism 92 can be properly controlled. For example, the entire overdrive operation or a part thereof can be performed by the vacuum mechanism 92.

Further, in the above embodiment, the controller 102 monitors the pressure in the line 90 based on the measured pressure signal MP outputted from the pressure sensor 98B of the electropneumatic regulator 98. In another configuration example, the controller 102 may monitor the pressure in the line 90 or in another line by using another pressure sensor different from the pressure sensor 98B.

While the disclosure has been shown and described with respect to the embodiments, it will be understood by those skilled in the art that various changes and modifications may be made without departing from the scope of the disclosure as defined in the following claims.

What is claimed is:

1. A wafer inspection apparatus comprising:
   a probe card having a plurality of contactors to be respectively brought into contact with a plurality of electrodes formed on a surface of a wafer as an inspection target;
   a chuck top on which the wafer is mounted to face the probe card;
   a vacuum mechanism configured to evacuate a sealable surrounding space surrounded by the chuck top and the probe card to a set pressure to allow or maintain a predetermined pressure-contact state between the probe card and the wafer,
   wherein the vacuum mechanism includes:
   a vacuum source;
   an electropneumatic regulator having a proportional control valve having a first port connected to the vacuum source and a second port connected to the surrounding space, a pressure sensor configured to measure a pressure in a predetermined gas channel or a space which is sealed and connected to the second port, and a valve control unit configured to control the proportional control valve such that a pressure measured by the pressure sensor becomes close to or equal to the set pressure in response to an electrical signal instructing a desired set pressure; and
   a gas channel network configured to be switched between a first mode in which the second port of the proportional control valve is connected to the surrounding space via the pressure sensor and a second mode in which the second port of the proportional control valve is connected to the surrounding space and the pressure sensor is connected to the surrounding space in parallel with the proportional control valve.

2. The wafer inspection apparatus of claim 1, wherein the gas channel network includes:
   a first switching valve having a third, a fourth and a fifth port;
   a first gas channel configured to connect the second port of the proportional control valve with the third port of the first switching valve;
   a second gas channel configured to connect the fourth port of the first switching valve with the surrounding space via the pressure sensor;
   a third gas channel configured to connect the fifth port of the first switching valve and the surrounding space; and
   a controller configured to control the first switching valve such that the third port is connected to the fourth port to select the first mode or the third port is connected to the fifth port to select the second mode.

3. The wafer inspection apparatus of claim 2, wherein the controller receives a measured pressure signal indicating a pressure in the second gas channel from the pressure sensor or another pressure sensor in the first mode and switches the first mode to the second mode when a waveform of the measured pressure signal is shifted from a falling area to a saturated area.

4. The wafer inspection apparatus of claim 1, wherein the vacuum mechanism further includes a compressed air source,
   wherein the proportional control valve further has a six port connected to the second port in parallel with the first port and also connected to the compressed air source, and
   wherein the electropneumatic regulator controls a pressure of the first port to a desired set value within a predetermined range by mixing a negative pressure and a positive pressure respectively inputted to the second port and the sixth port of the proportional control valve from the vacuum source and the compressed air source at a proper ratio.

5. The wafer inspection apparatus of claim 1, further comprising a movable table configured to detachably support the chuck top.

6. The wafer inspection apparatus of claim 5, wherein the movable table includes an elevation unit configured to vertically move the chuck top and the press-contact state is obtained between the probe card and the wafer by bringing the surface of the wafer on the chuck top into contact with the contactors of the probe card and pressing the chuck top by a desired overdrive amount.

7. The wafer inspection apparatus of claim 6, wherein after the elevation unit presses the chuck top by the desired overdrive amount, the gas channel network is switched to the first mode and the valve control unit controls the proportional control valve such that the pressure measured by the pressure sensor becomes close to or equal to the set pressure under the first mode, and
   wherein when the gas channel network is switched from the first mode to the second mode in a state where the measured pressure becomes stable in the saturated area, the valve control unit controls the proportional control valve such that the pressure measured by the pressure sensor becomes close to or equal to the set value under the second mode.

8. The wafer inspection apparatus of claim 1, further comprising:
   a cylindrical member provided around the probe card to be extensible and contractible in a direction perpendicular to a flat surface of the probe card; and
   a connecting part provided around a wafer mounting surface of the chuck top on which the wafer is mounted, the connecting part being detachably and sealably attached to the cylindrical member by a vacuum attractive force.

* * * * *